United States Patent

Prange et al.

[11] Patent Number: 5,991,789
[45] Date of Patent: Nov. 23, 1999

[54] CIRCUIT ARRANGEMENT FOR REALIZING LOGIC ELEMENTS THAT CAN BE REPRESENTED BY THRESHOLD VALUE EQUATIONS

[75] Inventors: Stefan Prange, München; Roland Thewes, Puchheim; Erdmute Wohlrab; Werner Weber, both of München, all of Germany

[73] Assignee: Siemens Aktiengesellschaft, Munich, Germany

[21] Appl. No.: 08/981,664

[22] PCT Filed: Jun. 4, 1996

[86] PCT No.: PCT/DE96/00981

§ 371 Date: Dec. 4, 1997

§ 102(e) Date: Dec. 4, 1997

[87] PCT Pub. No.: WO96/42048

PCT Pub. Date: Dec. 27, 1996

[30] Foreign Application Priority Data

Jun. 9, 1995 [DE] Germany .............................. 195 21 089

[51] Int. Cl.$^6$ ................................ G06F 7/52; G06F 7/50
[52] U.S. Cl. ............................................ 708/625; 708/702
[58] Field of Search ..................................... 708/230, 232, 708/234, 620, 700, 701, 702, 703; 326/35, 36

[56] References Cited

U.S. PATENT DOCUMENTS 3,609,329   9/1971   Martin ..................................... 708/675
3,950,636   4/1976   Dao .
4,423,339   12/1983  Seelbach et al. ........................ 326/36

FOREIGN PATENT DOCUMENTS 61-048229   8/1986   Japan .

OTHER PUBLICATIONS

CMOS Inplementation And Fabrication Of The Pseudo Analog Neuron—Taheri—1993 IEEE—p. 266–270.
New Types of digital Comparators—Hidalgo–Lopez et al—Publication Date Apr. 30, 1995—p. 29–32.
A Functional MOS Transistor Featuring Gate–Level Weighted Sum and Threshold Operations—Shibata et al—IEEE Transactions On Electron Devices, vol. 39, No. 6 Jun. 1992, p. 1444–1455.
Some New Schemes For Parallel Multipliers—Ferrari et al—100 Alta Frequenza—p. 843–851, Nov. 1969.
A New CMOS Neuron Circuit Based on a Cross–Coupled Current Comparator Structure—2334a IEICE Transactions on Fundamentals of Electronics, Communications and Computer Sciences—E75–A (1992) Jul., No. 7, Tokyuo JP, p. 937–943.

*Primary Examiner*—Chuong Dinh Ngo
*Attorney, Agent, or Firm*—Hill & Simpson

[57] ABSTRACT

In a circuit arrangement wherein all logic elements can be represented in the form of a threshold value equation, for this purpose, transistors connected in parallel of a transistor unit are dimensioned in such a way that the cross-currents flowing through the transistors respectively represent a weighted summand of a first term of the threshold value equation. A second term of the threshold value equation is formed by a reference current representing the second term value. An evaluation unit compares an overall current, which results from the sum of cross-currents, with the reference current. The evaluation result is present at an output of the evaluation unit in the form of a stable output signal.

7 Claims, 9 Drawing Sheets

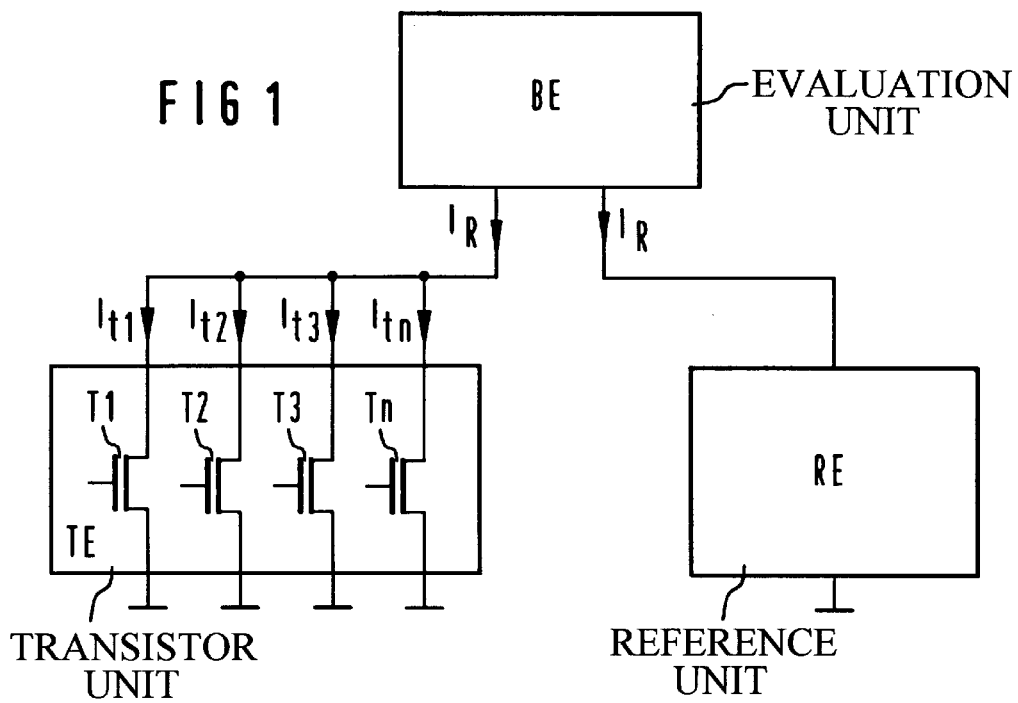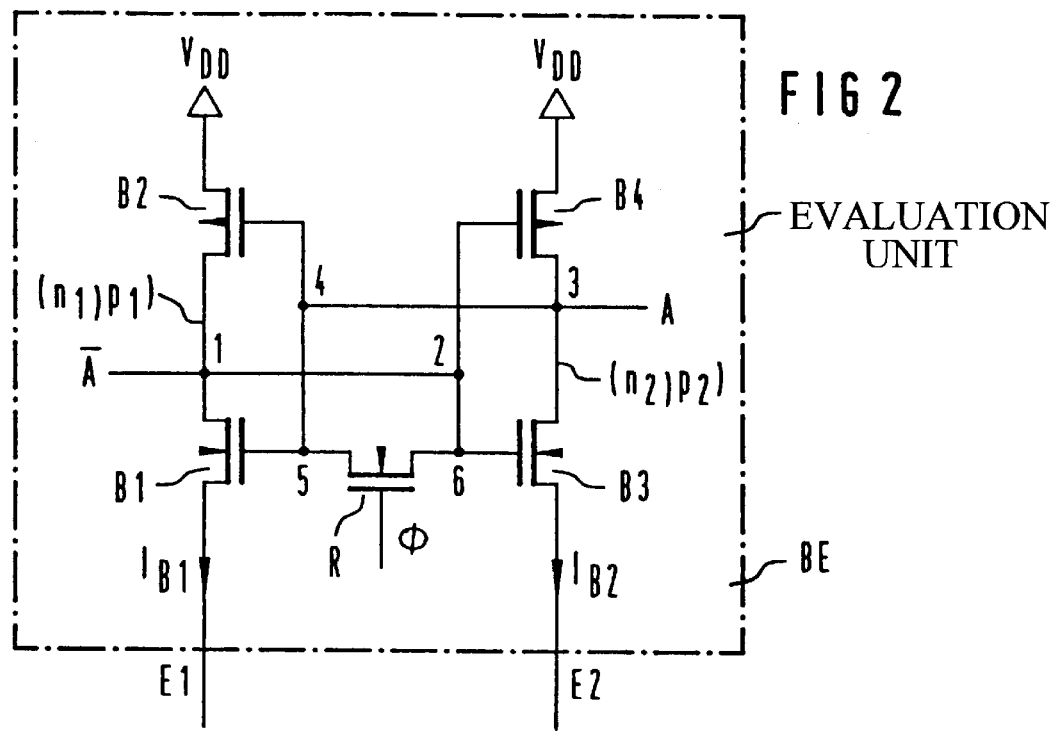

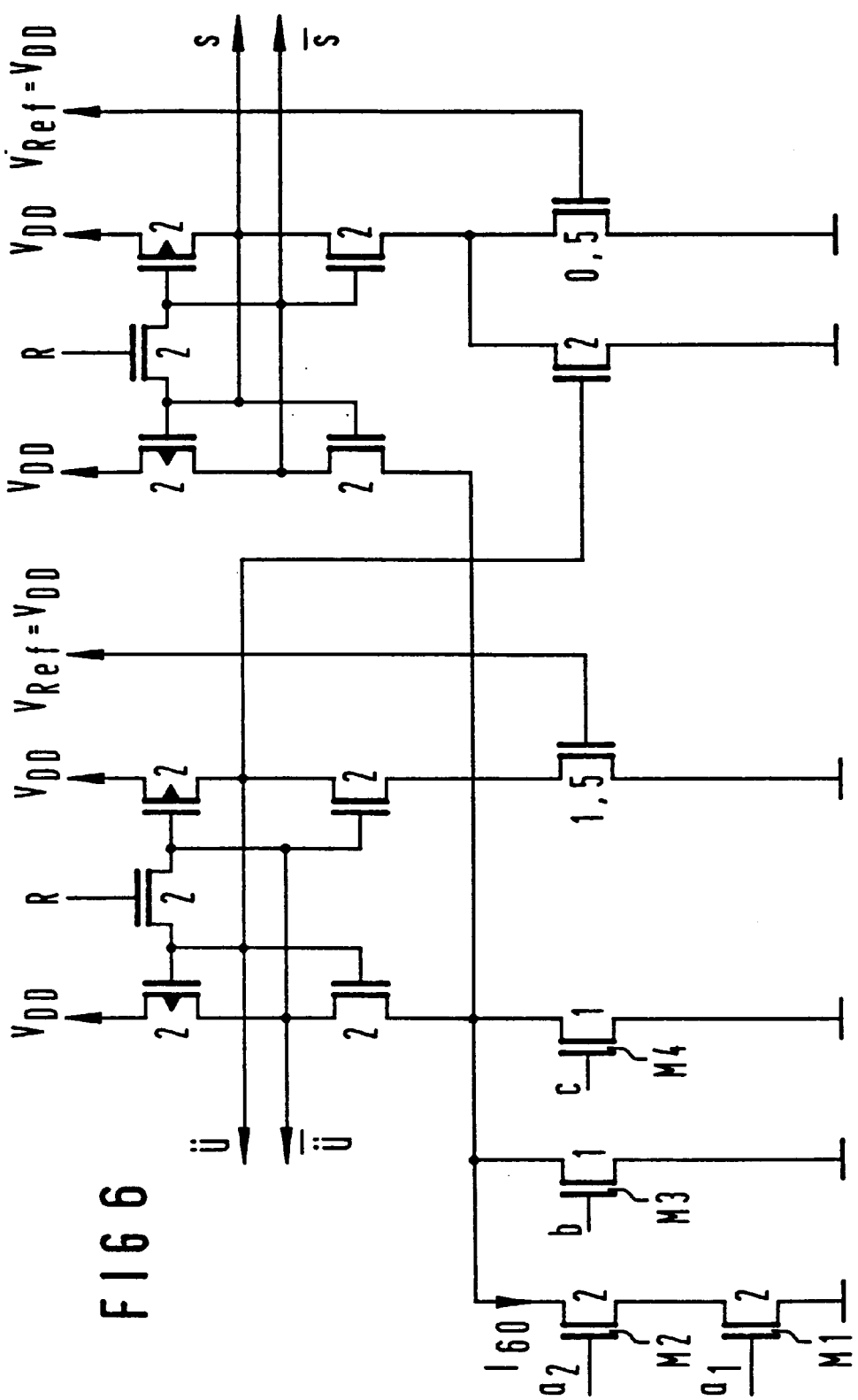

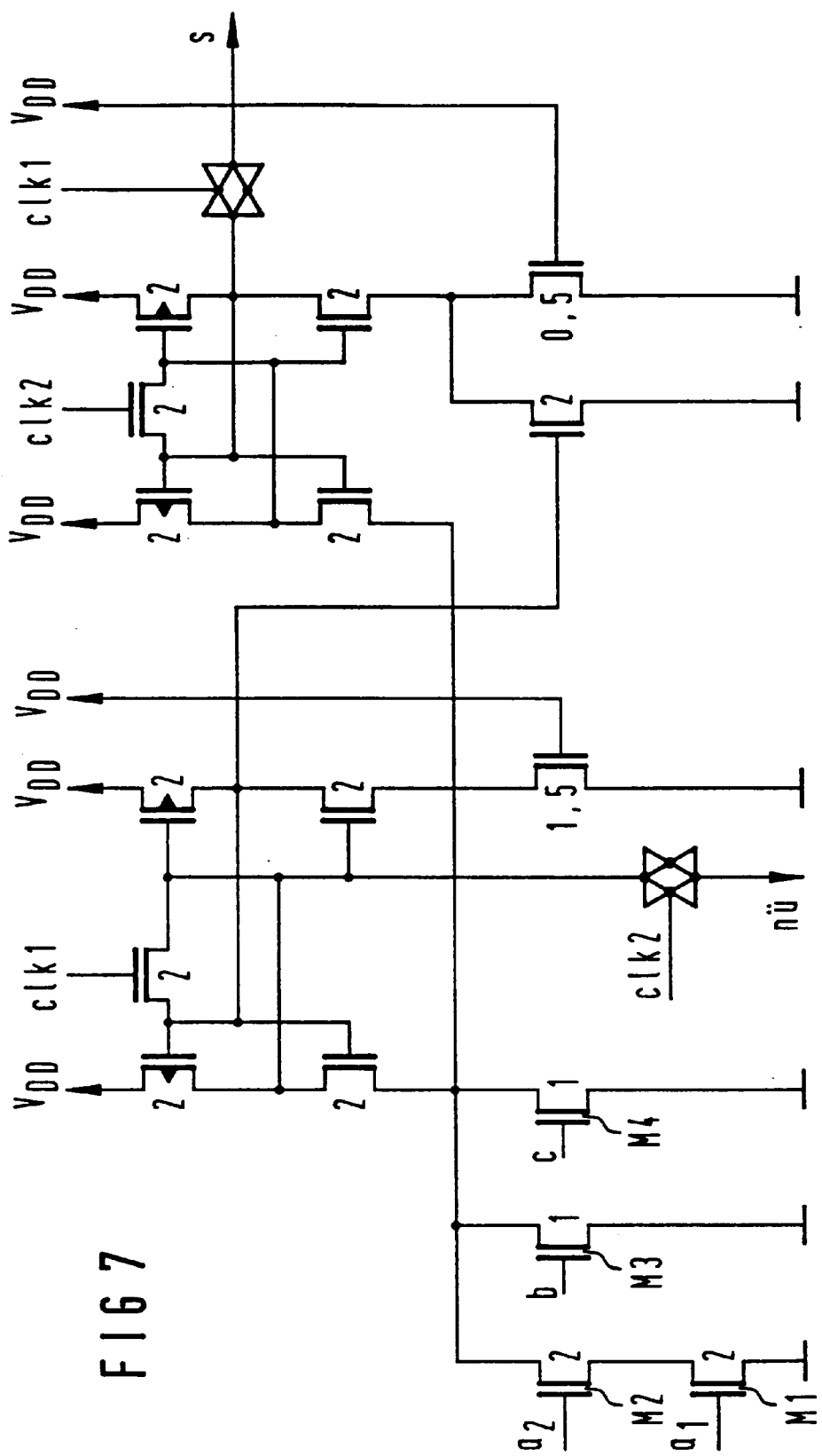

CIRCUIT ARRANGEMENT FOR REALIZING LOGIC ELEMENTS THAT CAN BE REPRESENTED BY THRESHOLD VALUE EQUATIONS

BACKGROUND OF THE INVENTION

Logic elements are basic modules of today's digital computers. Since these basic modules are often used in digital computers, an improvement of a basic module has the direct effect of improving the entire apparatus in which this basic module is used. Above all, the number of transistors required for the realization of the basic module, the power loss that is converted in the basic module, and the speed of this basic module, are particularly important for the efficiency and the quality of such a basic module. The use of standardized technology is also an essential factor in assessing the quality of such a basic module.

The realization of logical basic circuits based on their functional equation by resistance logic (RTL), by diode transistor logic (DTL), by slow noise-proof logic (LSL) and by transistor-transistor logic (TTL), by emitter-coupled logic (ECL), complementary MOS logic (CMOS) and by NMOS logic (see U. Tietze, Ch. Shenk, Halbleiterschaltungstechnik, $_9$th ed., Springer-Verlag, 1990, ISBN 3-540-19475-4, pp. 201–219), is known. The use of neuron MOS transistors for the realization of a binary full adder is also known (T. Shibata, T. Ohini: "A functional 1405 transistor featuring gate-level weighted sum and threshold operations," IEEE Transactions on Electron Devices, 39, pages 1444–1455, 1992). The disadvantages of these known circuit arrangements, are above all, that a larger number of transistors is required in comparison to the invention specified below. The speed of known circuit arrangements is also considerably less than that of the circuit arrangement of the invention. A considerable disadvantage of neuron MOS transistors is that a specific technology (EEPROM or analog process) has to be used.

From (J. A. Hidalgo-Lopez et al., New Types of Digital Comparators, IEEE International Symposium on Circuits and Systems (ISCAS), vol. 1, pp. 29–32, April 1995), a comparator circuit is known that comprises two regeneratively coupled inverter stages and a reset unit. Two electrical quantities to be compared are supplied to the outputs of the inverter stages, at which the comparison result is also present. The source terminals of both inverter stages are connected with one another, and are connected to the frame via a clock transistor.

From (D. Ferrari and R. Stefanelli, Some New Schemes for Parallel Multipliers, Alta Frequenza, vol. 38, no. 11, pp. 843 to 852, XP 0020141008, 1969), a basic structure of a multiplier cell on the system plane is known with two different units for the formation of an output carry bit, as well as of an output summation bit. Fundamentally, the use of resistor-transistor logic (RTL) is proposed. The two elements are connected with one another in such a way that an output signal of a first element is fed back to an input of the second element. The fed-back output signal is weighted differently at the input of the second element, than are all other input signals.

Basic principles of a neuron 1405 inverter are known from (T. Shibata et al., Neuron-MOS Binary Logic Integrated Circuits—Part 2: simplifying Techniques of Circuit Configuration and a Practical Applications [sic], IEEE Transactions on Electron Devices, vol. 40, no. 6, pp. 974–979, 1993).

SUMMARY OF THE INVENTION

It is an object of the invention to realize logic elements whose function can be described by a threshold value equation, while avoiding the disadvantages of known circuit arrangements.

According to the circuit arrangement of the invention for realizing logic elements, a transistor unit has a plurality of transistors, the transistors being dimensioned such that cross-currents flowing through the transistors respectively represent a summand of a first term of the threshold value equation. A reference unit provides the second term of the threshold value equation. An evaluation unit compares the first term with the second term. All the transistors of the transistor unit are connected in parallel, and are connected via an output of the transistor unit with a first input of the evaluation unit. An output of the reference unit is connected with a second input of the evaluation unit. The evaluation unit has a circuit arrangement for comparing two electrical quantities. The evaluation unit has a first inverter stage through which the first cross-current flows, a first input of the evaluation unit connecting to a source terminal of the first inverter stage. The second inverter stage through which a second cross-current flows is provided. The second input of the evaluation unit is connected to a source terminal of the second inverter stage. The first inverter stage and a second inverter stage are coupled such that an output of the first inverter stage is connected with an input of the second inverter stage and an output of the second inverter stage is connected with an input of the first inverter stage. A reset unit connected to the inputs of the first and second inverter stages compensates a difference in potential between an output potential of the first inverter stage and an output potential of the second inverter stage. The output potential of the first inverter stage describes a comparison result of the first cross-current with the second cross-current.

An essential advantage of this circuit arrangement is the smaller number of transistors required for the realization of a logical basic circuit. By means of the reduction of the number of transistors required, the required chip surface is also reduced, and a smaller overall capacitance of the circuit arrangement is achieved. In addition, a considerably lower power loss of the circuit arrangement is achieved, with high pulse rates in comparison with known circuit arrangements. The speed of the circuit arrangement of the invention is essentially increased in comparison with known circuit arrangements.

The drawings show preferred exemplary embodiments of the invention, and are specified in more detail in the following.

BRIEF DESCRIPTION OF THE DRAWINGS

FIG. 1 shows a drawing describing the principle of the circuit arrangement of the invention for the general realization of different logic elements a function of which can be described by threshold value equations;

FIG. 2 shows a possible realization of an evaluation unit with which two electrical quantities can be compared with one another;

FIG. 6 shows a drawing of an advantageous development of a circuit arrangement of the invention of a multiplier cell;

FIG. 7 shows a drawing of a circuit arrangement of the invention of a multiplier cell with carry-ripple addition of the partial products, and used in a field multiplier cell with pipelining;

DESCRIPTION OF THE PREFERRED EMBODIMENTS

Figure 3:
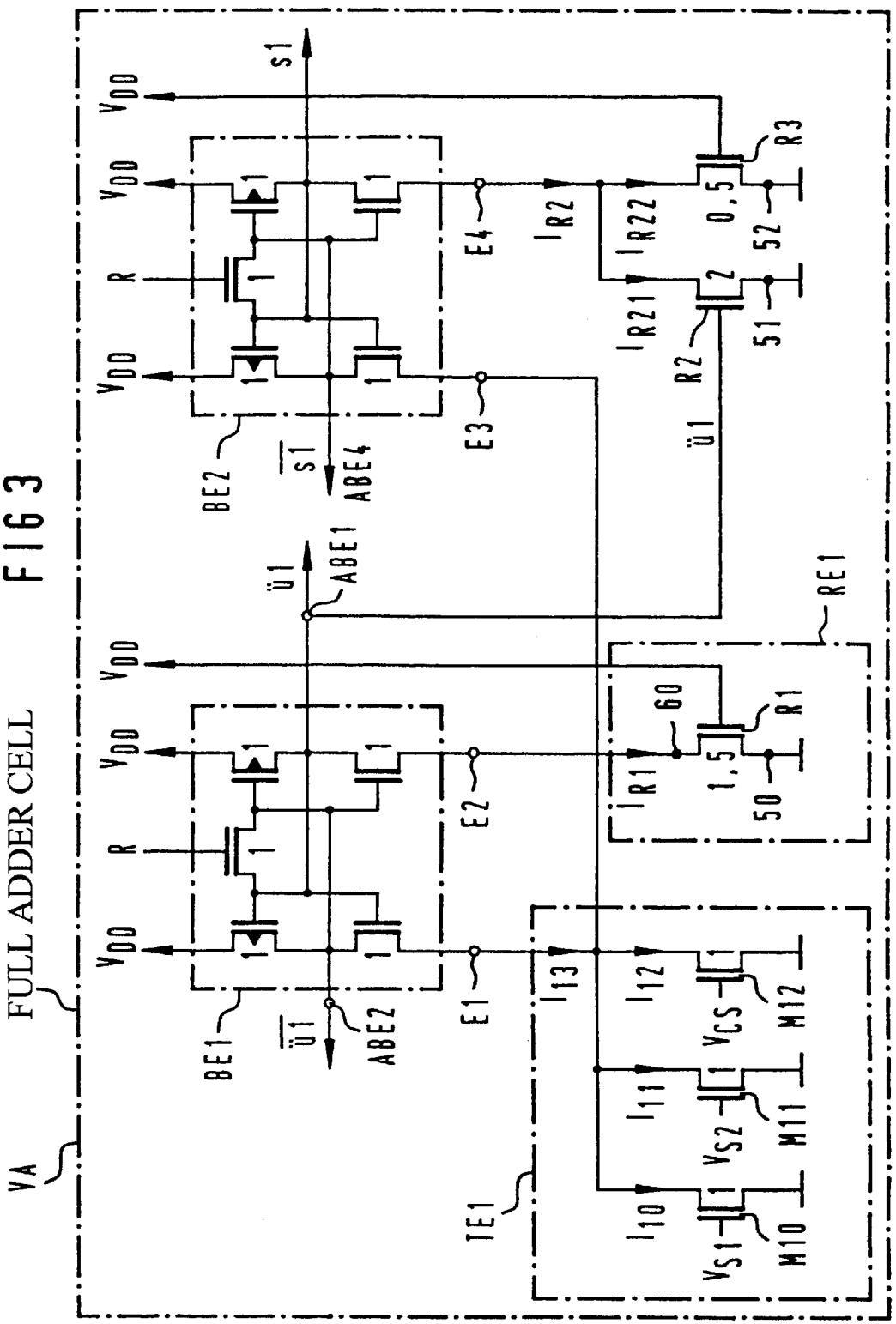
FIG. 3 shows a drawing of a circuit arrangement of the invention for realizing a full adder cell, in which the input potentials of the full adder cells are provided both for the formation of the output carry bit and for the formation of the output summation bit.

The invention is explained in more detail on the basis of FIGS. 1 to 11a–c.

FIG. 1 shows the design of the circuit arrangement for realizing logic elements whose function can be described by threshold value equations. This circuit arrangement is not limited to the exemplary embodiments specified below, but rather can be applied to any logical function for realization in the form of a correspondingly adapted circuit arrangement of the invention that can be described by a threshold value equation. The design of the circuit arrangement of the invention is as follows.

A transistor unit TE comprises at least one MOS field-effect transistor. The drain terminals thereof are coupled with one another in such a way that an overall current $I_g$ represents the sum of all cross-currents $I_{t2}$, $I_{t3}$ ... $I_{tn}$ of the transistors T1, T2, T3, ... Tn contained in the transistor unit TE (n is the number of transistors present in the transistor unit TE). The source terminals of the individual transistors T1, T2, T3, ... Tn are coupled with a first operating potential $V_{ss}$. The transistors contained in the transistor unit TE represent, in their totality, a first term of a threshold value equation that describes a logic function. A second term of the threshold value equation is formed by a reference unit RE in the form of a reference current $I_R$.

The comparison, required in a threshold value equation, of two input quantities, the first term of the threshold value equation and the second term of the threshold value equation, which are represented by the overall current $I_g$ and the reference current $I_R$ is carried out by an evaluation unit BE, in that the evaluation unit BE topples into a stable state that represents the result of the comparison of the two quantities to be compared.

Evaluation unit

The evaluation unit BE has the construction described below (cf. FIG. 2). It comprises a first inverter stage ($n_1$, $p_1$) with an n-channel MOS field-effect transistor B1 and a p-channel MOS field-effect transistor B2, through which there flows at the time of the evaluation a first evaluation current $I_{B1}$ which is equal to the current that flows into the evaluation unit BE via a first input E1 of the evaluation unit BE, and thus to the overall current in the circuit arrangement of the invention. At the time of the evaluation, a second evaluation current $I_{B2}$ which is equal to the current that flows into the evaluation unit BE via the second input E2 of the evaluation unit BE, flows through a second inverter stage ($n_2$, $p_2$) formed of an n-channel MOS field-effect transistor B3 and a p-channel MOS field-effect transistor B4.

An output 1 of the first inverter stage ($n_1$, $p_1$) is connected with an input 2 of the second inverter stage ($n_2$, $p_2$). An output 3 of the second inverter stage ($n_2$, $p_2$) is connected with an input 4 of the first inverter stage ($n_1$, $p_1$). The input 4 of the first inverter stage ($n_1$, Pi) is moreover connected with a second terminal 5 of a reset unit R. A first terminal 6 of the reset transistor R is connected with the input 2 of the second inverter stage ($n_2$, $p_2$). Via a control signal to the gate terminal of the reset transistor R, the difference in potential between a first output potential A and a second output potential $\overline{A}$ of the evaluation unit BE is compensated when the control signal $\Phi$ is activated, and the evaluation unit BE is thereby reset to a defined output state.

For the explanation of the function of the evaluation unit BE it is assumed that equal potential is initially present at the output 3 of the second inverter stage ($n_2$, $p_2$) and at the output 1 of the first inverter stage ($n_1$, $p_1$). If the first evaluation current $I_{B1}$ is greater than the second evaluation current $I_{B2}$ there results therefrom a somewhat lower potential at the output 1 of the first inverter stage ($n_1$, $p_1$) than at the output 3 of the second inverter stage ($n_2$, $p_2$).

The p-channel MOS field-effect transistor B4, whose gate terminal is coupled with the output 1 of the first inverter stage ($n_1$, $p_1$), thereby conducts better than the p-channel MOS field-effect transistor B2. The n-channel MOS transistor 23, whose gate terminal is likewise coupled with the output 1 of the first inverter stage ($n_1$, $p_1$), conducts worse than the n-channel MOS field-effect transistor B1. Thus, the potential at the output 3 of the second inverter stage ($n_2$, $p_2$) is raised until a second operating potential $V_{DD}$ is finally reached. Correspondingly, at the output 1 of the first inverter stage ($n_1$, $p_1$), a potential of 0 volts is finally reached. A stable state of the evaluation unit BE is thereby reached.

If at the time of the evaluation a second evaluation current $I_{B2}$ greater than the first evaluation current $I_{B2}$ flows through the second inverter stage ($n_2$, $p_2$, then, corresponding to the process described above, a potential of 0 volts appears at the output 3 of the second inverter stage ($n_2$, $p_2$), and the second operating potential $V_{DD}$ appears at the output 1 of the first inverter stage ($n_1$, $p_1$).

During the evaluation process, the evaluation unit BE has a very high inner amplification and a very good driver capacity, and can thus be operated at high frequencies.

Before a new evaluation can occur, the difference in potential between the first output potential A, which is present at the output 1 of the first inverter stage ($n_1$, $p_2$), and the second output potential $\overline{A}$, which is present at the output 3 of the second inverter stage ($n_2$, $p_2$) must be compensated, i.e., the circuit arrangement must be reset. This takes place by means of the reset unit R realized by an n-channel MOS field-effect transistor, controlled by a control signal $\Phi$. It is also possible to use a p-channel MOS field-effect transistor instead of an n-channel MOS field-effect transistor for the realization of the reset unit R.

The resetting process using an n-channel MOS field-effect transistor as a reset unit R is introduced when the control signal $\Phi$ is switched to a high level. The resetting process using a p-channel MOS field-effect transistor as a reset unit R is introduced when the control signal $\Phi$ is switched to a low level.

The charge compensation can lead to a compensation at a high or at a low level, dependent on asymmetrical loads at the output 3 of the second inverter stage ($n_2$, $p_2$) or, respectively, at the output 1 of the first inverter stage ($n_1$, $p_1$) If an n-channel MOS field-effect transistor is used to realize the reset unit R, a good compensation of the two output potentials A and $\overline{A}$ occurs at a low and at a middle level.

At high levels close to the second operating potential $V_{DD}$, the compensation is incomplete under certain circumstances. The MOS field-effect transistors B2 and B4 then conduct poorly, but the MOS field-effect transistors Bi and B3 conduct well. This leads to a rapid decrease of the potential to a lower level, at which the n-channel MOS field-effect transistor for the realization of the reset transistor R conducts better, and can bring about the compensation of potential. Given the use of a p-channel MOS field-effect transistor in place of the n-channel MOS field-effect transistor for the realization of the reset transistor R, an analogous argument also leads to a good compensation of the potentials at the output 1 of the first inverter stage ($n_1$, $p_1$) and at the output 3 of the second inverter stage ($n_2$, $p_2$). If the control signal $\Phi$ is deactivated, the new evaluation begins, which leads to new values at the outputs, i.e. the evaluation unit BE is activated, and quickly topples into a stable state.

Moreover, due to the fact that there are only a few, namely 3, transistors in series between the second operating potential $V_{DD}$ and the first operating potential $V_{SS}$, there results an excellent suitability of the circuit arrangement of the invention for applications with low operating voltages.

Full adder cells

The function of a full adder cell VA can be expressed by two threshold value equations. A first summand bit $V_{S2}$, a second summand bit $V_{CS}$ and a carry bit of a preceding partial sum $V_{CS}$ are present at the full adder cell VA as input potentials. The full adder cell VA described in FIG. 3 provides the following signals as output signals: a first output carry bit ü1, a negated first output carry bit $\overline{ü1}$, a first output summation bit s1 and a negated first output summation bit $\overline{s1}$ (cf. FIG. 3)

The full adder cell VA described in FIG. 3 has the following construction.

A first transistor unit TE1, which has the same design as the transistor unit TE, is constructed, for the realization of the full adder cell VA, from a tenth MOS field-effect transistor M10, an eleventh MOS field-effect transistor M11, and a twelfth MOS field-effect transistor M12.

The numerical values located directly at the MOS field-effect transistors respectively indicate the channel width/channel length ratio of the respective MOS field-effect transistor in relation to a minimum width/minimum length.

The first summand bit $V_{S1}$ is present at the tenth MOS transistor M10, and controls a tenth cross-current $I_{10}$. An eleventh cross-current $I_{11}$ flowing through the eleventh MOS transistor till is controlled by the second summand bit $V_{S2}$. A twelfth cross-current $I_{12}$ flows through the twelfth transistor M12, which is controlled by the carry bit of a preceding partial sum $V_{CS}$. The drain terminals of the MOS field-effect transistors M10, M11 and M12 are coupled with one another, so that a first overall current $I_{13}$ results from the sum of the tenth cross-current $I_{10}$, the eleventh cross-current $I_{11}$, and the twelfth cross-current $I_{12}$.

The sum of the input potentials $V_{S1}$, $V_{S2}$, $V_{CS}$ represents a first term (S1+S2+CS) of a first threshold value equation for calculating the first output carry bit ill. The input potentials $V_{S1}$, $V_{S2}$, $V_{CS}$ respectively represent a summand corresponding to the selected designations of the first term of the first threshold value equation. The overall first threshold value equation for the calculation of the first output carry bit ü1 of the full adder cell VA has the following construction:

$$S1+S2+CS>1.5 \Leftrightarrow ü1=1$$

A second term of the first threshold value equation with the value 1.5 is formed by a first reference current $I_{R1}$ representing this value, which flows through a first reference transistor R1. The first reference transistor R1 forms a first reference unit RE1, corresponding to the reference unit RE (cf. FIG. 1). A gate terminal of the first reference transistor R1 is connected with the second operating potential $V_{DD}$. A terminal 50 of the first reference transistor R1 is coupled with the frame potential.

At the time of the evaluation, the first overall current 113 flows into the first evaluation unit BE1 via a first input E1 of a first evaluation unit BE1, which has the same construction as the evaluation unit BE. At the time of the evaluation, the first reference current $I_{R1}$ likewise flows into the first evaluation unit BE1 via a second input E2 of the first evaluation unit BE1, so that when the first evaluation unit BE1 is activated the comparison of the first overall current $I_{13}$ with the first reference current $I_{R1}$ takes place.

The first output carry bit ü1 at a first output ABE1 of the first evaluation unit BE1 is logical 1 if and only if the first threshold value equation is fulfilled. In this case, the negated first output carry bit $\overline{ü1}$, which is present at a second output ABE2 of the first evaluation unit BE1, is logical 0.

If the first threshold value equation is not fulfilled, the first output carry bit ü1 is logical 0, and the negated first output carry bit $\overline{ü1}$ is logical 1.

Since the first evaluation unit BE1 is without current when it is toppled into a stable state, a second evaluation unit BE2, likewise of the same construction as the evaluation unit BE, can be operated for the calculation of the first output summation bit s1 and of the negated first output summation bit $\overline{s1}$ with the first transistor unit TE1 that is coupled with the first input E3 of the second evaluation unit BE2, with which the first evaluation unit BE1 is connected to the first input E1 of the first evaluation unit BE1. For this purpose, it is necessary to control the first evaluation unit BE1 and the second evaluation unit BE2 in such a way that a reset unit of the second evaluation unit BE2 does not reset and then activate the second evaluation unit BE2 until the first evaluation unit BE1 is toppled into a stable state, thus the first output carry bit ü1 is stably adjacent; i.e., at no time may the first evaluation unit BE1 and the second evaluation unit BE2 be simultaneously active. However, this does not represent a limitation of the full adder cell, since for the evaluation of the second threshold value equation the first output carry bit ü1 must be present in stable fashion anyway. This is necessary because it enters directly into the second threshold value equation.

This enables a considerable reduction in the number of transistors required, whereby of course the required chip surface for the respective basic module is also reduced, since the first transistor unit TE1 is used only once for the first evaluation unit BE1 and the second evaluation unit BE2.

When the first evaluation unit BE1 goes into a stable state, at the time of the evaluation in the second evaluation unit BE2 the first overall current $I_{13}$ flows through the second evaluation unit BE2 via the first input E3 of the second evaluation unit BE2, for the formation of the first output summation bit s1.

In this context, the sum of the input potentials $V_{S1}$, $V_{S2}$, $V_{S3}$ represents a first term (S1+S2+CS) of a second threshold value equation for the calculation of the first output summation bit s1. The input potentials $V_{S1}$, $V_{S2}$, $V_{CS}$ respectively represent a summand corresponding to the selected designations of the first term of the second threshold value equation. The overall second threshold value equation for the calculation of the first output summation bit s1 of the full adder cell VA has the following construction:

$$S1+S2+CS>0.5+2*\ddot{u}1 \Leftrightarrow s1=1$$

A second term of the second threshold value equation, with the value (0.5+2*ü), is formed by a second reference current $I_{R2}$ representing this value. This means that the second reference current $I_{R2}$ for the second evaluation unit BE2 is not a fixed quantity, but rather depends on the result of the evaluation of the first evaluation unit BE1. In this context, i.e. for the formation of the first output summation bit s1, the reference unit RE from FIG. 1 comprises in FIG. 3 a second reference transistor R2 and a third reference transistor R3, whereby a cross-current $I_{R22}$ flowing through the second reference transistor R2 represents twice the value of the first output carry bit ü1, thus 2*ü1. A cross-current $I_{R21}$, which flows through the third reference transistor R3, represents the value 0.5. The second reference current $I_{R2}$ thereby represents the second term of the second threshold value equation (0.5+2*ü1).

The drain terminals of the second reference transistor R2 and of the third reference transistor R3 and a second input E4 of the second evaluation unit BE2 are connected. A gate terminal of the second reference transistor R2 is connected with the first output of the first evaluation unit BE1. By means of the dimensioning of the second reference transistor R2, the first output carry bit ü1 receives the necessary weighting with the factor 2. A terminal 51 of the second reference transistor R2 is coupled with the frame potential and with a terminal 52 of the third reference transistor R3.

The gate terminal of the third reference transistor R3 is connected with the second operating potential $V_{DD}$.

At the time of the evaluation in the second evaluation unit BE2, the first overall current 113 flows into the second evaluation unit BE2 via a first input E3 of the second evaluation unit BE2. At the time of the evaluation in the second evaluation unit BE2, the second reference current $I_{R2}$ likewise flows into the second evaluation unit BE2 via a second input E4 of the second evaluation unit BE2, so that when the second evaluation unit BE2 is activated, the comparison of the first overall current $I_{13}$ with the second reference current $I_{R1}$ takes place.

The first output summation bit s1 at a first output ABE3 of the second evaluation unit BE2 is logical 1 if and only if the second threshold value equation is fulfilled. In this case, the negated first output summation bit $\overline{s1}$ is logical 0.

If the second threshold value equation is not fulfilled, the first output summation bit s1 is logical 0 and the negated first output summation bit $\overline{s1}$ is logical 1.

If the first summand bit $V_{S1}$, the second summand bit $V_{S2}$ and the carry bit of a preceding partial sum $V_{CS}$ simultaneously switch to a potential with the value 0 after an evaluation with the result ü1 =0 at the second output ABE2 of the first evaluation unit BE1 and/or with the result $\overline{s1}$=0 at a second output ABE4 of the second evaluation unit BE2, the case can occur in which the second output ABE2 of the first evaluation unit BE1, the first input E1 of the first evaluation unit BE1, the second output ABE4 of the second evaluation unit BE2 and the first input E3 of the second evaluation unit BE2 become floating nodes, i.e. floating.

However, since the second output ABE2 of the first evaluation unit BE1 and the second output ABE4 of the second evaluation unit BE2 are not further used in the full adder cell for the realization of the full adder cell VA, this case has no effect on the functioning of the full adder cell VA. However, insofar as problems e.g. due to capacitive couplings at these nodes, which could lead to a change of the evaluation results, cannot be excluded, it is possible to remedy this situation by expanding the first transistor unit TE1 by a first additional transistor L1, via which in each case a low-ohm connection of the first input E1 of the first evaluation unit BE1 and of the first input E3 of the second evaluation unit BE2 to the frame potential is created, and thus the charges of the floating node can run off. The first additional transistor L1 can e.g. comprise a channel width/channel length ratio with the value 1, in relation to the minimum width/minimum length ratio. A drain terminal of the first additional transistor L1 is connected with the drain terminals of the other transistors contained in the first transistor unit TE1. The gate terminal of the first additional transistor L1 is coupled with the second operating potential $V_{DD}$.

By means of the technique described above, at the time of the evaluation in the first evaluation unit BE1 the first overall current $I_{13}$ is increased, or, respectively, at the time of the evaluation in the second evaluation unit BE2 a second overall current $I_{14}$ is increased. So that the evaluation nonetheless further yields the correct comparison result, in this case the first reference current $I_{R1}$ and the second reference current $1_{R2}$ must also be increased with the same technique. This can, for example, be achieved by means of an alteration of the dimensioning of the first reference transistor R1 and of the third reference transistor R3 in the corresponding manner.

Multiplier cell

Figure 4:
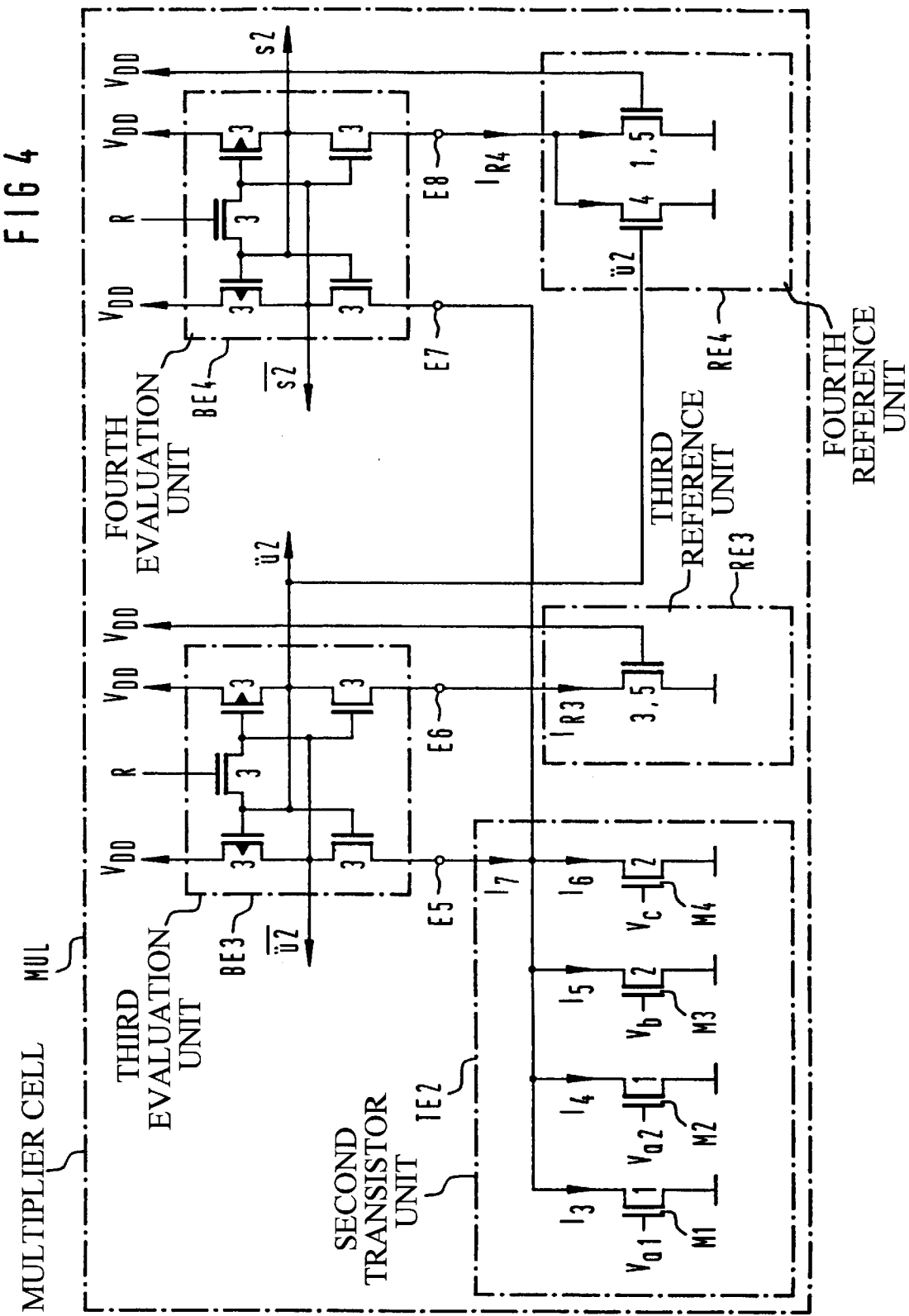
FIG. 4 shows a drawing of a circuit arrangement of the invention of a multiplier cell in which the input potentials of the multiplier cell are provided both for the formation of the output carry bit and for the formation of the output summation bit.

The function of a multiplier cell MUL can likewise be expressed by two threshold value equations. A multiplier bit $V_{a1}$ a multiplicand bit $V_{a2}$ a summation bit of a preceding partial sum $V_b$ and a carry bit of a preceding partial sum $V_c$ are present at the multiplier cell MUL as input potentials. The multiplier cell MUL specified in FIG. 4 provides the following signals as output signals: A second output carry bit ü2, a negated second output carry bit $\overline{\ddot{u}2}$, a second output summation bit s2 and a negated second output summation bit $\overline{s2}$ (cf. FIG. 4)

The multiplier cell MUL specified in FIG. 4 has the same design as the full adder cell VA specified above (cf. FIG. 3) However, the two threshold value equations of the multiplier cell MUL have a different construction.

A third threshold value equation, provided for the calculation of the second output carry bit ü2 as well as of the negated second output carry bit $\overline{\ddot{u}2}$, has the following construction:

$$(a_1+a_2)+2*b+2*c>3.5.$$

The second output carry bit ü2 is logical 1 if and only if the third threshold value equation yields a true result.

A fourth threshold value equation, provided for the calculation of the second output summation bit s2 as well as of the negated second output summation bit $\overline{s2}$, has the following construction:

$$(a_1+a_2)+2*b+2*c>1.5+4*\ddot{u}.$$

The second output summation bit s2 is logical 1 if and only if the fourth threshold value equation yields a true result.

In the two formulas above, the designations of the variables are respectively selected corresponding to the designations of the input potentials of the multiplier cell MUL.

In order to realize the third threshold value equation and the fourth threshold value equation, it is necessary to construct a second transistor unit TE2, a third reference unit RE3 and a fourth, reference unit RE4 in such a way, in comparison with the full adder cell VA, that the third threshold value equation and the fourth threshold value equation are represented. For this purpose, it is for example necessary to add a further transistor in the second transistor unit TE2, so that the four input potentials required in the multiplier cell MUL can be applied. The dimensionings of the transistors of the second transistor unit TE2 must also be adapted to the third threshold value equation and to the fourth threshold value equation, e.g. by means of alteration of the channel width/channel length ratios, in relation to the minimum width/minimum length ratio, of the individual transistors of the second transistor unit TE2.

The second transistor unit TE2 thus comprises the following MOS field-effect transistors:

M1, through which a third cross-current $I_3$ flows at the time of activation of the evaluation units, the value of the current representing the multiplier bit $V_{a1}$, M2, through which a fourth cross-current $I_4$ flows at the time of activation of the evaluation units, the value of the current representing the multiplicand bit $V_{a2}$, M3, through which a fifth cross-current $I_5$ flows at the time of activation of the evaluation units, the value of the current representing the summation bit of a preceding partial sum $V_b$, multiplied by a factor of 2, and M4, through which a sixth cross-current $I_6$ flows at the time of activation of the evaluation units, the value of the current representing the carry bit of a preceding partial sum $V_C$, multiplied by a factor of 2.

The cross-currents $I_3$, $I_4$, $I_5$ and $I_6$ together form a second overall current $I_7$, which, given activation, flows into a third evaluation unit BE3 via a first input ES of the third evaluation unit BE3, which is provided for the formation of the second output carry bit ü2. When the second output carry bit ü2 is present in stable fashion, a fourth evaluation unit BE4, provided for the formation of the second output summation bit s2, is to be reset and reactivated. At this time, the third evaluation unit BE3 is without current, and the second overall current $I_7$ thus flows into the fourth evaluation unit BE4 via a first input E5 of the fourth evaluation unit BE4.

A third reference current $I_{R3}$ as well as a fourth reference current $I_{R4}$ are formed by means of a third reference unit RE3 and a fourth reference unit RE4, which have the same design as the reference unit RE. Only the dimensioning of the transistors that respectively form the third reference unit RE3 and the fourth reference unit RE4 is adapted in such a way that the third reference current $I_{R3}$ and the fourth reference current $I_{R4}$ respectively represent a second term of the third threshold value equation and a second term of the fourth threshold value equation.

Each functional equation, and thus each logic element, that can be represented by at least one threshold value equation, can be realized according to the principle specified above.

Figure 5:
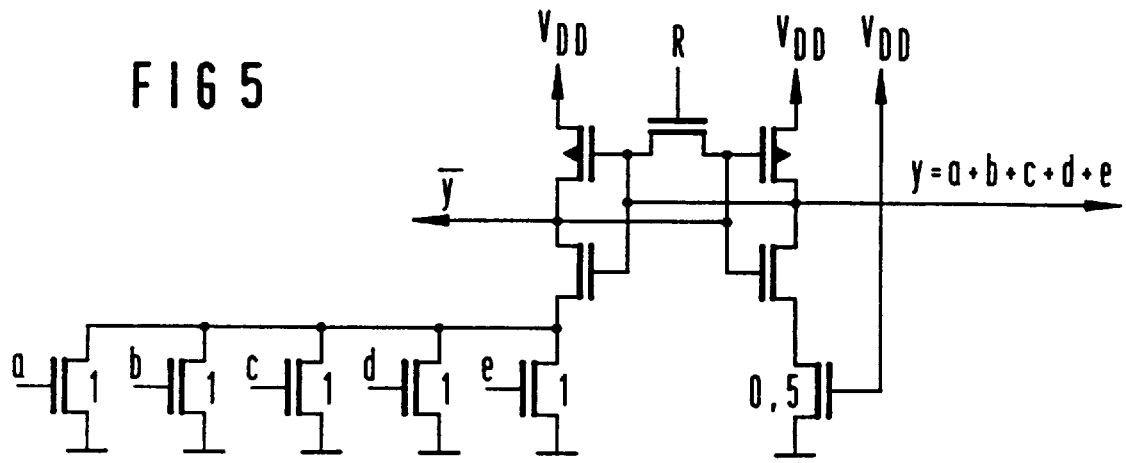
FIG. 5 shows a drawing of a circuit arrangement of the invention for the realization of a quintuple OR gate.

FIG. 5 shows, for example, a circuit arrangement of the invention for the realization of a fivefold OR gate.

An advantageous development of the circuit arrangement of the invention for realizing a binary multiplier cell is shown in FIG. 6.

In the circuit arrangement of the invention described in FIG. 6, the transistors M1 and M2 are connected not in parallel, but in series, so that they lie in a current path. An AND crosscurrent $I_{60}$ flows through this current path. The AND crosscurrent $I_{60}$ flows only when both the multiplier bit $V_{a1}$ and the multiplicand bit $V_{a2}$ are logical 1. This corresponds to the realization of the AND gate required in a binary multiplier cell. The dimensioning of the MOS field-effect transistors M1, M2, M3 and M4 must be designed in such a way that the cross-currents flowing through the MOS field-effect transistors M1, M2, M3 and M4 represent the first term of the first threshold value equation.

This can, for example, be achieved in that the channel width/channel length ratio of the MOS field-effect transistors M1 and M2, in relation to a minimum width/minimum length, has the value 2. The channel width/channel length ratio of the MOS field-effect transistors M3 and M4, in relation to a minimum width/minimum length, are allocated the value.

Correspondingly, the channel width/channel length ratio of the MOS field-effect transistor of the third reference unit RE3 must also be dimensioned to the value 1.5. The dimensionings of the further MOS field-effect transistors are indicated in FIG. 6, whereby the numerical values directly at the MOS field-effect transistors respectively indicate the channel width/channel length ratio of the respective MOS field-effect transistor, in relation to a minimum width/minimum length.

An advantage of the development of the circuit arrangement of the invention specified in FIG. 6 is that the second overall current 17 was reduced by a factor of 2, so that the MOS field-effect transistors of the circuit arrangement of the invention can be dimensioned smaller (cf. FIG. 6).

With this dimensioning, a reduction of the space requirement and a reduction of the power loss of the multiplier cell thus results.

Moreover, the relative minimum current differences to be detected have respectively become larger by a factor of 2, which deactivates the threshold value condition.

For the use of the multiplier cell specified above in field multipliers with pipelining, attention is to be paid to the following. The second output carry bit 112 becomes stable after the reset unit R of the third evaluation unit BE3 is shifted from the conductive state back into the blocking state. The reset unit R of the fourth evaluation unit BE4 may not be shifted from the conductive state back into the blocking state until the second output carry bit ü2 is stable. Moreover, for the entire duration of the calculation, all the input signals must be present in stable fashion. It thus suggests itself to apply the input signals with a clock signal clk1 to the gate terminals of the MOS field-effect transistors of the second transistor unit TE2. Likewise, the clock signal clk1 should also be applied to the reset unit R of the third evaluation unit BE3. For the input signals, attention is to be paid to the fact that they must have the full voltage range, because the comparison with a reference voltage occurs. Thus, transfer gates should be used for the application of the input signals. Given the application of the input signals via individual transfer transistors, the voltage range is reduced by an operating potential. The second output carry bit ü2 and the second output summation bit s2 can become unstable when, in the binary multiplier cell for non-inverted input signals, all input signals are at 0 volts and the inverted output signal of the last-executed evaluation was at 0 volts, or when, in a binary multiplier cell for inverted input signals (cf. FIG. 9), all input signals are at the second operating potential $V_{DD}$ and the inverted output signal of the last previously executed evaluation was at the second operating potential $V_{DD}$. In the multiplier cell for non-inverted input signals, this affects above all the inverted outputs, and in the cell for inverted input signals it affects above all the non-inverted outputs. The output signals should thus be scanned before the input signals change, if possible.

The use of the described cells in field multipliers with pipelining is simple if three non-overlapping clock signals clk1, clk2, clk3 are available. The first clock signal clk1 can effect the application of the input signals and the reset process for the formation of the second output carry bit ü2, a second clock signal clk2 resets the fourth evaluation unit BE4 for the formation of the second output summation bit s2, and a third clock signal clk3 takes care of the coupling out of the output signals, and thus for the application of the input signals to the next multiplier cell. However, in currently used circuits with pipelining, only two non-overlapping clock pulses clk1 and clk2, and possibly the clock pulses inverse thereto, nclk1 and nclk2, are provided in standard fashion. In these circumstances, the following solution possibility can be used.

If the input signals are controlled with the clock signal clk1 and the reset unit R of the third evaluation unit B3 is likewise controlled with the first clock signal clk1, then the second output carry bit can be applied to another cell already with the second clock signal clk2. This cell is thus particularly suited for rapid field multipliers with carry-ripple addition of the partial products. Since the input signals are still stable during the active phase of the second clock signal clk2, both the second output carry bit ü2 and the negated second output carry bit ü2 can be securely coupled out. In such a carry-ripple architecture described in FIG. 8, the multiplier bit $V_{a1}$ has to be delayed by means of a latch. Since inverting latches are simpler to realize than non-inverting ones, it suggests itself to couple out the negated second output carry bit ü2. From these considerations, there also result demands on the delaying of the multiplicand bit $V_{a2}$. The multiplicand bit $V_{a2}$ must be delayed with three latches, and can likewise be used in inverted form (cf. FIG. 8)

Figure 10:
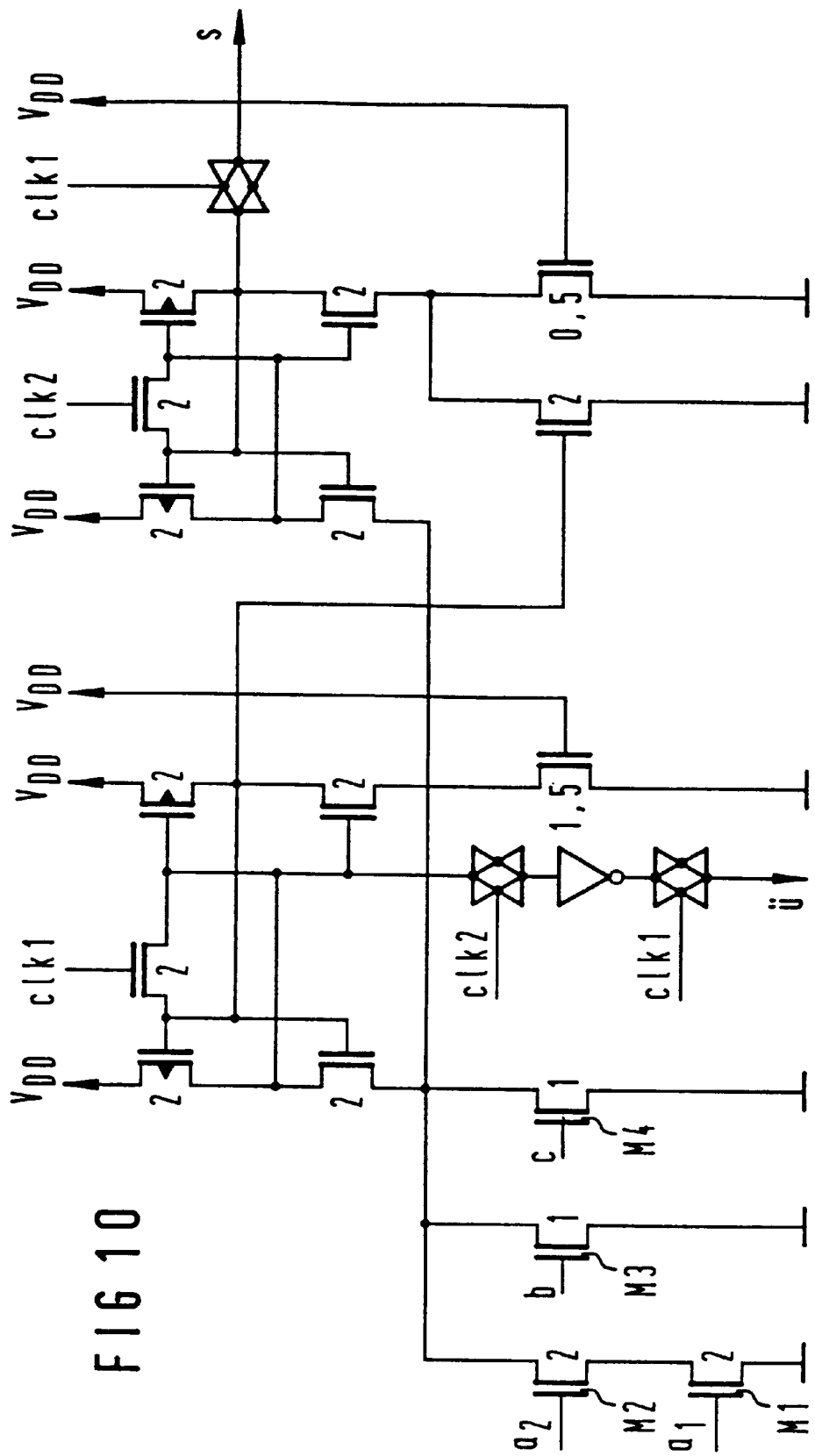
FIG. 10 shows a drawing of a circuit arrangement of the invention of a multiplier cell with carry-save addition of the partial products, which is used in a field multiplier with pipelining.

FIG. 10 shows a circuit arrangement of the invention of a multiplier cell with carry-save addition of the partial products. This multiplier cell can also be used advantageously in a field multiplier with pipelining.

Figure 8:
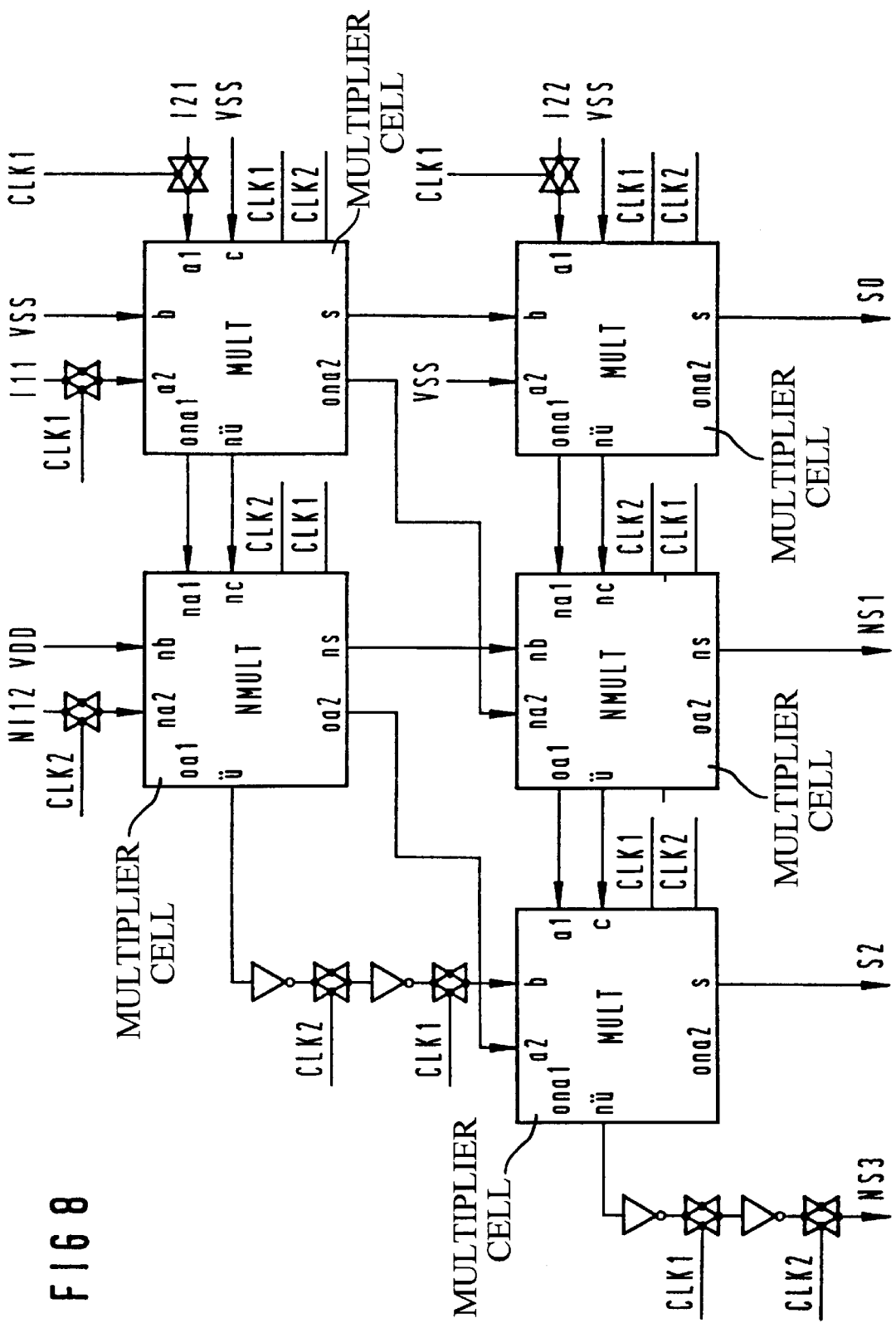
FIG. 8 shows a drawing describing the construction of a field multiplier with carry-ripple addition of the partial products and two-dimensional pipelining, in which a multiplier cell of the invention is used.
Figure 9:
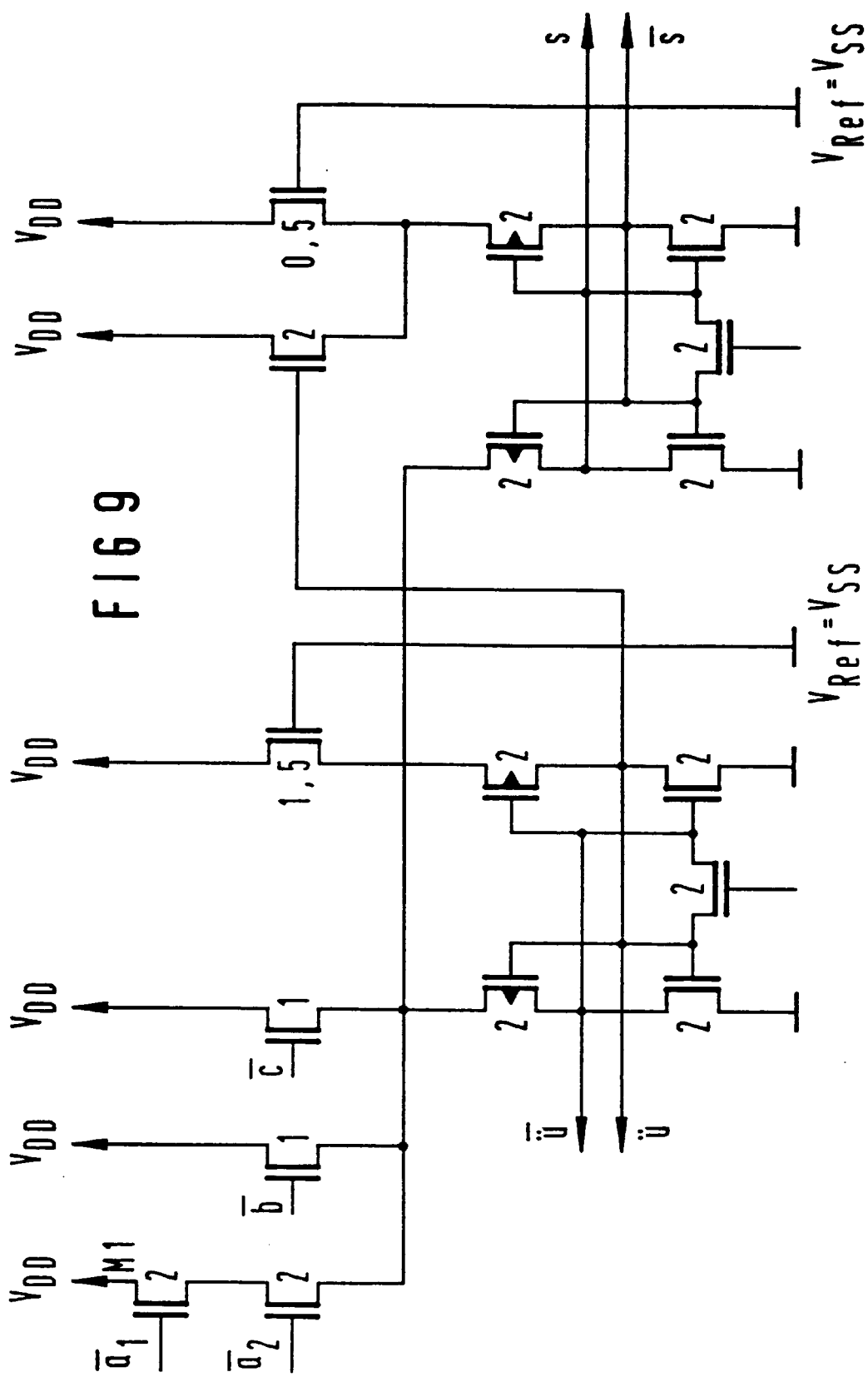
FIG. 9 shows a drawing of a circuit arrangement of the invention of a multiplier cell for inverted input signals.

The circuit blocks designated MULT in FIG. 8 respectively 10 represent the multiplier cell shown in FIG. 7 for non-inverted input signals.

The circuit blocks designated with NMULT represent a multiplier cell for inverted input signals, obtained by 15exchanging the n-channel MOS field-effect transistors with p-channel MOS field-effect transistors, and by exchanging the p-channel MOS field-effect transistors with n-channel MOS field-effect transistors, except for the transistors that are used as reset units.

A first least significant bit I11 and a first data bit NI12 hereby form a first data word, and a second least significant bit I21 and a second data bit I22 form a second data word. By means of the field multiplier shown, the first data word is multiplied by the second data word. The result of the multiplication is represented by result bits NS3, S2, S1 and S0, whereby in this context the symbol N describes the corresponding bit in negated form. NS3 thus designates the inverted result bit S3.

The presented principle of the field multiplier can easily be extended to any data word width by anyone skilled in the art.

A symbol o written at the beginning of a signal designation designates an output signal of the respective circuit block MULT or NMULT. Thus, for example, oa1 designates an output signal, representing the multiplier bit a1, of a circuit block.

A symbol n written at the beginning of a signal designation designates the corresponding signal in negated form. Thus, for example, onal designates a negated output signal, representing the negated multiplier bit a1, of a circuit block.

Figure 11A:
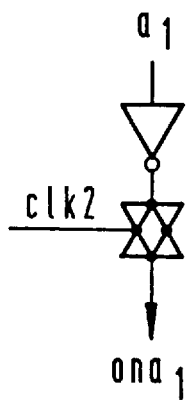
FIG. 11a–c show drawings in which it is described how the signals $ona_1$, $ona_2$, and $ona_2$ result from the multiplier bit $a_1$ and the multiplicand bit $a_2$.

As is shown in FIG. 11a, the multiplier bit a1 is moreover delayed by a latch, corresponding to FIG. 7.

Figure 11B:
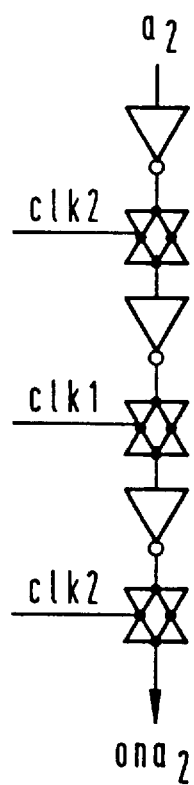

The signal ona2 also results from the multiplicand bit a2 by means of multiple delaying using several latches (cf. FIG. 11b).

Figure 11C:
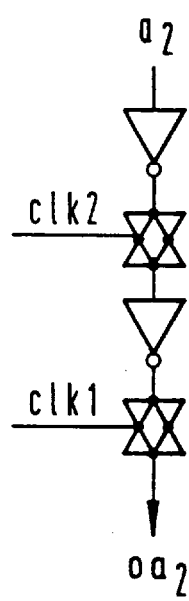

The signal oa2 results in the way shown in FIG. 11c.

Attention is to be paid that negated outputs of a circuit block are coupled with negated inputs of a further circuit block.

Non-negated outputs of a circuit block are likewise coupled with non-negated inputs of a further circuit block.

Although various minor changes and modifications might be proposed by those skilled in the art, it will be understood that our wish is to include within the claims of the patent warranted hereon all such changes and modifications as reasonably come within our contribution to the art.

We claim as our invention:

1. A circuit arrangement for realizing logic elements, comprising:

a transistor unit having a plurality of transistors, the transistors being dimensioned such that cross-currents flowing through the transistors respectively represent a summand of a first term of a threshold value equation;

a reference unit for providing a second term of said threshold value equation;

an evaluation unit for comparing said first term with said second term;

all the transistors of the transistor unit being connected in parallel, and being connected via an output of the transistor unit with a first input of the evaluation unit;

an output of the reference unit being connected with a second input of the evaluation unit; and said evaluation unit comprising a circuit arrangement for comparing two electrical quantities, wherein
   a first inverter stage through which flows a first cross-current having a value representing the first term,
   the first input of the evaluation unit connecting to a source terminal of the first inverter stage,
   a second inverter stage through which flows a second cross-current having a value representing the second term,
   the second input of the evaluation unit connecting to a source terminal of the second inverter stage,
   the first inverter stage and the second inverter stage being regeneratively coupled such that an output of the first inverter stage is connected with an input of the second inverter stage and an output of the second inverter stage is connected with an input of the first inverter stage, and
   a reset unit connected to the inputs of the first and second inverter stages for compensating a difference in potential between an output potential of the first inverter stage and an output potential of the second inverter stage, and the output potential of the first inverter stage describing a comparison result of the first cross-current with the second cross-current.

2. The circuit arrangement according to claim 7, wherein the reference unit comprises at least one reference transistor coupled with a terminal to the second input of the evaluation unit.

3. The circuit arrangement according to claim 7, wherein the transistor unit is provided for several comparisons by use of several evaluation units.

4. A binary full adder cell, comprising:

a transistor unit having a plurality of transistors, the transistors being dimensioned such that cross-currents flowing through the transistors respectively represent a summand of a first term of a threshold value equation;

a reference unit for providing a second term of said threshold value equation;

an evaluation unit for comparing said first term with said second term;

all the transistors of the transistor unit being connected in parallel, and being connected via an output of the transistor unit with a first input of the evaluation unit;

an output of the reference unit being connected with a second input of the evaluation unit; and said evaluation unit comprising a circuit arrangement for comparing two electrical quantities, wherein a first inverter stage through which flows a first cross-current having a value representing the first term, the first input of the evaluation unit connecting to a source terminal of the first inverter stage, a second inverter stage through which flows a second cross-current having a value representing the second term, the second input of the evaluation unit connecting to a source terminal of the second inverter stage, the first inverter stage and the second inverter stage being regeneratively coupled such that an output of the first inverter stage is connected with an input of the second inverter stage and an output of the second inverter stage is connected with an input of the first inverter stage, and a reset unit connected to the inputs of the first and second inverter stages for compensating a difference in potential between an output potential of the first inverter stage and an output potential of the second inverter stage, and the output potential of the first inverter stage describing a comparison result of the first cross-current with the second cross-current.

5. A binary multiplier cell, comprising:

a transistor unit having a plurality of transistors, the transistors being dimensioned such that cross-currents flowing through the transistors respectively represent a summand of a first term of a threshold value equation;

a reference unit for providing a second term of said threshold value equation;

an evaluation unit for comparing said first term with said second term;

all the transistors of the transistor unit being connected in parallel, and being connected via an output of the transistor unit with a first input of the evaluation unit;

an output of the reference unit being connected with a second input of the evaluation unit; and said evaluation unit comprising a circuit arrangement for comparing two electrical quantities, wherein a first inverter stage through which flows a first cross-current having a value representing the first term, the first input of the evaluation unit connecting to a source terminal of the first inverter stage, a second inverter stage through which flows a second cross-current having a value representing the second term, the second input of the evaluation unit connecting to a source terminal of the second inverter stage, the first inverter stage and the second inverter stage being regeneratively coupled such that an output of the first inverter stage is connected with an input of the second inverter stage and an output of the second inverter stage is connected with an input of the first inverter stage, and a reset unit connected to the inputs of the first and second inverter stages for compensating a difference in potential between an output potential of the first inverter stage and an output potential of the second inverter stage, and the output potential of the first inverter stage describing a comparison result of the first cross-current with the second cross-current.

6. A field multiplier having several multiplier cells, each multiplier cell comprising:

a transistor unit having a plurality of transistors, the transistors being dimensioned such that cross-currents flowing through the transistors respectively represent a summand of a first term of a threshold value equation;

a reference unit for providing a second term of said threshold value equation;

an evaluation unit for comparing said first term with said second term;

all the transistors of the transistor unit being connected in parallel, and being connected via an output of the transistor unit with a first input of the evaluation unit;

an output of the reference unit being connected with a second input of the evaluation unit; and said evaluation unit comprising a circuit arrangement for comparing two electrical quantities, wherein a first inverter stage through which flows a first cross-current having a value representing the first term, the first input of the evaluation unit connecting to a source terminal of the first inverter stage, a second inverter stage through which flows a second cross-current having a value representing the second term, the second input of the evaluation unit connecting to a source terminal of the second inverter stage, the first inverter stage and the second inverter stage being regeneratively coupled such that an output of the first inverter stage is connected with an input of the second inverter stage and an output of the second inverter stage is connected with an input of the first inverter stage, and a reset unit connected to the inputs of the first and second inverter stages for compensating a difference in potential between an output potential of the first inverter stage and an output potential of the second inverter stage, and the output potential of the first inverter stage describing a comparison result of the first cross-current with the second cross-current.

7. A circuit arrangement for realizing logic elements, comprising:

a transistor unit having at least one transistor, the transistor being dimensioned such that a cross-current flowing through the transistor respectively represents a summand of a first term of a threshold value equation;

a reference unit for providing a second term of said threshold value equation;

an evaluation unit for comparing said first term with said second term;

the transistor of the transistor unit being connected via an output of the transistor unit with a first input of the evaluation unit;

an output of the reference unit being connected with a second input of the evaluation unit; and said evaluation unit comprising a circuit arrangement for comparing two electrical quantities, wherein a first inverter stage through which flows a first cross-current having a value representing the first term, the first input of the evaluation unit connecting to a source terminal of the first inverter stage, a second inverter stage through which flows a second cross-current having a value representing the second term, the second input of the evaluation unit connecting to a source terminal of the second inverter stage, the first inverter stage and the second inverter stage being regeneratively coupled such that an output of the first inverter stage is connected with an input of the second inverter stage and an output of the second inverter stage is connected with an input of the first inverter stage, and a reset unit connected to the inputs of the first and second inverter stages for compensating a difference in potential between an output potential of the first inverter stage and an output potential of the second inverter stage, and the output potential of the first inverter stage describing a comparison result of the first cross-current with the second cross-current.

* * * * *